(12) United States Patent
Tomita (10) Patent No.: US 10,644,478 B2
(45) Date of Patent: May 5, 2020

(54) LIGHT SOURCE MODULE AND METHOD OF MANUFACTURING LIGHT SOURCE MODULE

(71) Applicant: NEC CORPORATION, Tokyo (JP)

(72) Inventor: Isao Tomita, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 134 days.

(21) Appl. No.: 15/757,525

(22) PCT Filed: Sep. 12, 2016

(86) PCT No.: PCT/JP2016/004141
§ 371 (c)(1),
(2) Date: Mar. 5, 2018

(87) PCT Pub. No.: WO2017/047069
PCT Pub. Date: Mar. 23, 2017

(65) Prior Publication Data
US 2018/0248335 A1    Aug. 30, 2018

(30) Foreign Application Priority Data

Sep. 15, 2015  (JP) ................................ 2015-181946

(51) Int. Cl.
*H01S 5/02* (2006.01)
*H01S 5/022* (2006.01)
(Continued)

(52) U.S. Cl.
CPC .......... *H01S 5/022* (2013.01); *G02B 27/0977* (2013.01); *H01S 5/02446* (2013.01);
(Continued)

(58) Field of Classification Search
CPC .... H01S 5/022; H01S 5/0687; H01S 5/02415; H01S 5/02284; H01S 5/02216; H01S 5/142; H01S 5/02446; G02B 27/0977
See application file for complete search history.

(56) References Cited

U.S. PATENT DOCUMENTS

| 2002/0012369 | A1  | 1/2002 | Nasu et al. |
| 2003/0123819 | A1* | 7/2003 | Nakanishi ............ G02B 6/4214 385/92 |

(Continued)

FOREIGN PATENT DOCUMENTS

| CN | 103270443 A | 8/2013 |
| JP | 2002-43686 A | 2/2002 |

(Continued)

OTHER PUBLICATIONS

Communication dated Jun. 14, 2019, from the State Intellectual Property Office of People's Republic of China in counterpart Application No. 201680053336.1.

(Continued)

*Primary Examiner* — Selim U Ahmed
(74) *Attorney, Agent, or Firm* — Sughrue Mion, PLLC (57) ABSTRACT

Provided are: a light source module capable of having a reduced packaging area size while ensuring wavelength precision; and a method for manufacturing this light source module. This light source module is provided with a light amplifying means, a wavelength monitoring means for detecting a change in wavelength of light outputted from the light amplifying means, and a reflecting means which is disposed between the light amplifying means and the wavelength monitoring means, and which is for reflecting the light outputted from the light amplifying means toward the wavelength monitoring means.

8 Claims, 4 Drawing Sheets

(51) Int. Cl.
| | |
|---|---|
| *H01S 5/024* | (2006.01) |
| *H01S 5/14* | (2006.01) |
| *G02B 27/09* | (2006.01) |
| *H01S 5/0687* | (2006.01) |

(52) U.S. Cl.
CPC .......... *H01S 5/142* (2013.01); *H01S 5/02216* (2013.01); *H01S 5/02284* (2013.01); *H01S 5/02415* (2013.01); *H01S 5/0687* (2013.01)

(56) References Cited

U.S. PATENT DOCUMENTS

2008/0187268 A1    8/2008   Kaneko et al.
2013/0266264 A1   10/2013   Tomita

FOREIGN PATENT DOCUMENTS

| JP | 2003-110190 A | 4/2003 |
|---|---|---|
| JP | 2003-258364 A | 9/2003 |
| JP | 2004-117730 A | 4/2004 |
| JP | 2008-193003 A | 8/2008 |
| JP | 2009-146992 A | 7/2009 |

OTHER PUBLICATIONS

International Search Report for PCT/JP2016/004141 dated Dec. 6, 2016.

\* cited by examiner

LIGHT SOURCE MODULE AND METHOD OF MANUFACTURING LIGHT SOURCE MODULE

CROSS REFERENCE TO RELATED APPLICATIONS

This application is a National Stage of International Application No. PCT/JP2016/004141 filed Sep. 12, 2016, claiming priority based on Japanese Patent Application No. 2015-181946 filed Sep. 15, 2015.

TECHNICAL FIELD

The present invention relates to a light source module and a method of manufacturing the light source module, and in particular to a variable wavelength type light source module and a method of manufacturing of the light source module.

BACKGROUND ART

In recent years, expansion of transmission capacity has been needed because of rapid growth of communication traffic. An optical communication module is a key device for an optical network system, and the optical communication module requires downsizing and high speed as the system increases its high speed and capacity. Digital coherent communication using multi-value phase modulation as a means for solving increase of the capacity of an optical communication system is widely distributed, and a transceiver for the digital coherent communication requires downsizing with increase of the capacity of the system.

Figure 4:
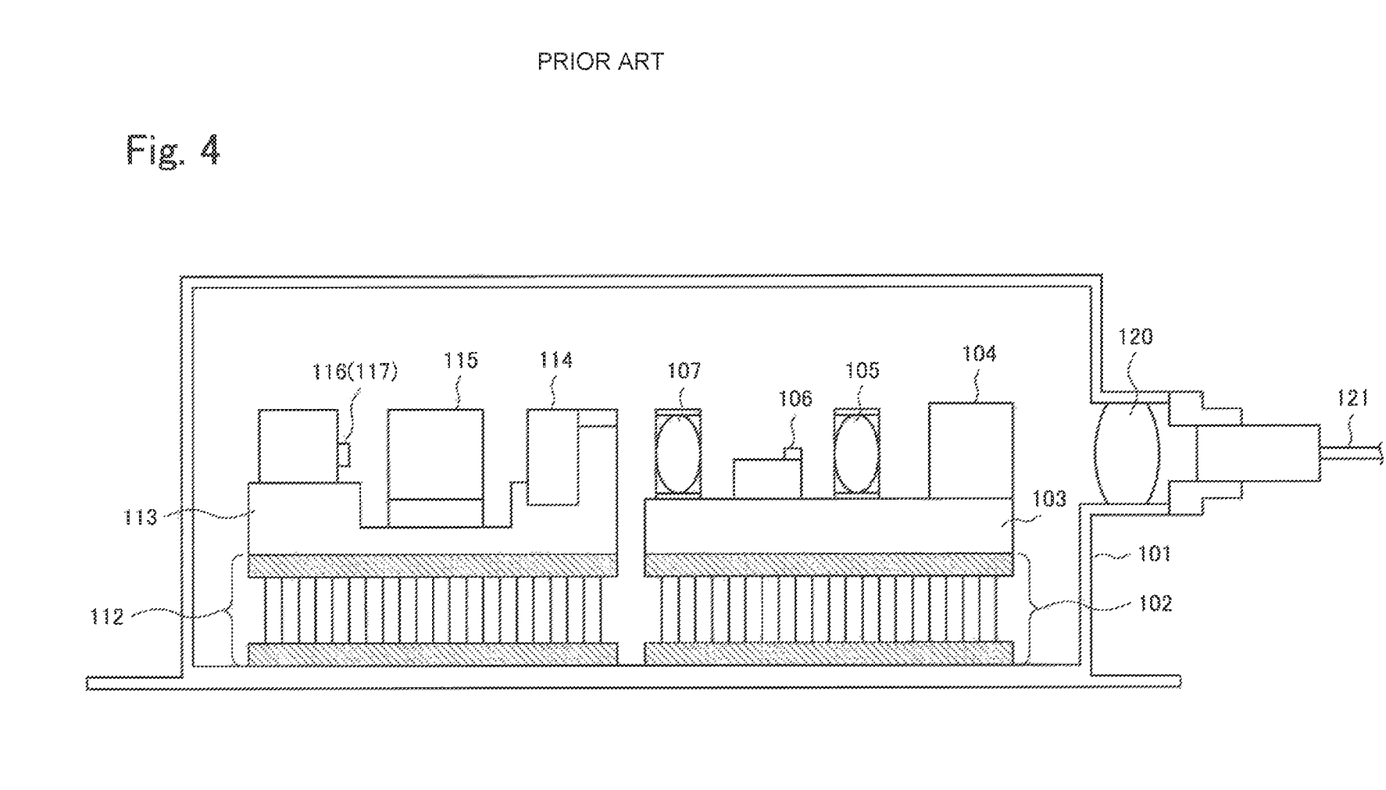
FIG. 4 is a side view for explaining the laser module of PTL1.

Patent literature 1 (PTL1) proposes the laser module which has a wavelength monitoring unit, monitors a wavelength of an optical signal, and keep it constant, as a technology realizing stability of the wavelength of the optical signal. As shown in FIG. 4, in the laser module of PTL1, a first thermo-module 102 and a second thermo-module 112 are disposed to be close to each other on a bottom face of a package 101. The first thermo-module 102 and the second thermo-module 112 are devices which can heat and cool a surface thereof depending on a value and a direction of a flowing current, and are composed of a Peltier element or the like.

A base 103 is mounted on the first thermo-module 102, and a semiconductor laser element 106 and a parallel lens 105 which converts a laser light outputted from a front end face of the semiconductor laser element 106 into a parallel light are further placed thereon. An isolator 104 which blocks a reflected return light from an optical fiber 121 side and a parallel lens 107 which converts a monitoring laser light outputted from a back end face of the semiconductor laser element 106 into a parallel light are mounted on the base 103.

A base 113 is mounted on the second thermo-module 112, and a prism 114 which splits the monitoring laser light outputted from the back end face of the semiconductor laser element 106 into two directions at a predetermined angle is further mounted thereon. A first optical detector 116 which detects one light split by the prism 114 and a second optical detector 117 which detects a light which passes through an optical filter 115 in the other light split by the prism 114 are further mounted on the base 113. The optical filter 115 is composed of Fabry-Perot etalon. The optical filter 115, the first optical detector 116, the second optical detector 117 and the like compose the wavelength monitoring unit of PTL1.

In the laser module of PTL1, with respect to the monitoring laser light outputted from the back end face of the semiconductor laser element 106, the first optical detector 116 and the second optical detector 117 which receives the light which passes through the optical filter 115 detects a shift of wavelength. The first thermo-module 102 under the semiconductor laser element 106 is controlled, for example, in order to change temperature of the semiconductor laser element 106 to correct the shift of wavelength. The temperature of the semiconductor laser element 106 is adjusted by the first thermo-module 102 and feedback-controlled to suppress change of wavelength.

The laser light outputted from the front end face of the semiconductor laser element 106 is converted into a parallel right by the parallel lens 105 and connected with an optical fiber 121 by a condensing lens 120. The light transmitted in the optical fiber 121 is utilized for a desired use.

CITATION LIST

Patent Literature

[PTL1] Japanese Laid-Open Patent No. 2003-110190

SUMMARY OF INVENTION

Technical Problem

It is common that an etalon element is mounted in the laser module for optical communication above mentioned in order to ensure wavelength precision. Since such a laser module for optical communication includes many components mounted in the module, there is an issue that a packaging area size is increased.

The laser module of PTL1 also includes the optical filter 115 composed of the Fabry-Perot etalon in the wavelength monitoring unit. In the laser module of PTL1, the semiconductor laser element 106 and the wavelength monitoring unit are placed on the bottom face of the package 101 with the first thermo-module 102, the bases 103, 113, and the like in between. This poses an issue that a packaging area size of the laser module is increased.

An object of the present invention is to provide a light source module ensuring wavelength precision and reducing a packaging area size, and a method of manufacturing the light source module.

Solution to Problem

To achieve the above-mentioned object, a light source module according to the present invention comprises a light amplifying means; a wavelength monitoring means for detecting a change in wavelength of light outputted from the light amplifying means; and a reflecting means for reflecting the light outputted from the light amplifying means toward the wavelength monitoring means, the reflecting means being disposed between the light amplifying means and the wavelength monitoring means.

A method of manufacturing a light source module according to the present invention, which houses at least a light amplifying means and a wavelength monitoring means for detecting a change in wavelength of light outputted from the light amplifying means in a package having a bottom part and a lid part, the method comprises:

fixing the light amplifying means on a side of the bottom part of the package;

fixing the wavelength monitoring means on a side of the lid part of the package;

fixing, on the side of the bottom part of the package, one part of a reflecting means for reflecting light outputted from the light amplifying means toward the wavelength monitoring means;

fixing, on the side of the lid part of the package, another part of the reflecting means for reflecting the light outputted from the light amplifying means toward the wavelength monitoring means; and housing the light amplifying means, the wavelength monitoring means, and the reflecting means between the bottom part of the package and the lid part of the package.

Advantageous Effects of Invention

According to the present invention, the light source module ensuring wavelength precision and having a reduced packaging area size is realized.

DESCRIPTION OF EMBODIMENTS

Figure 1:
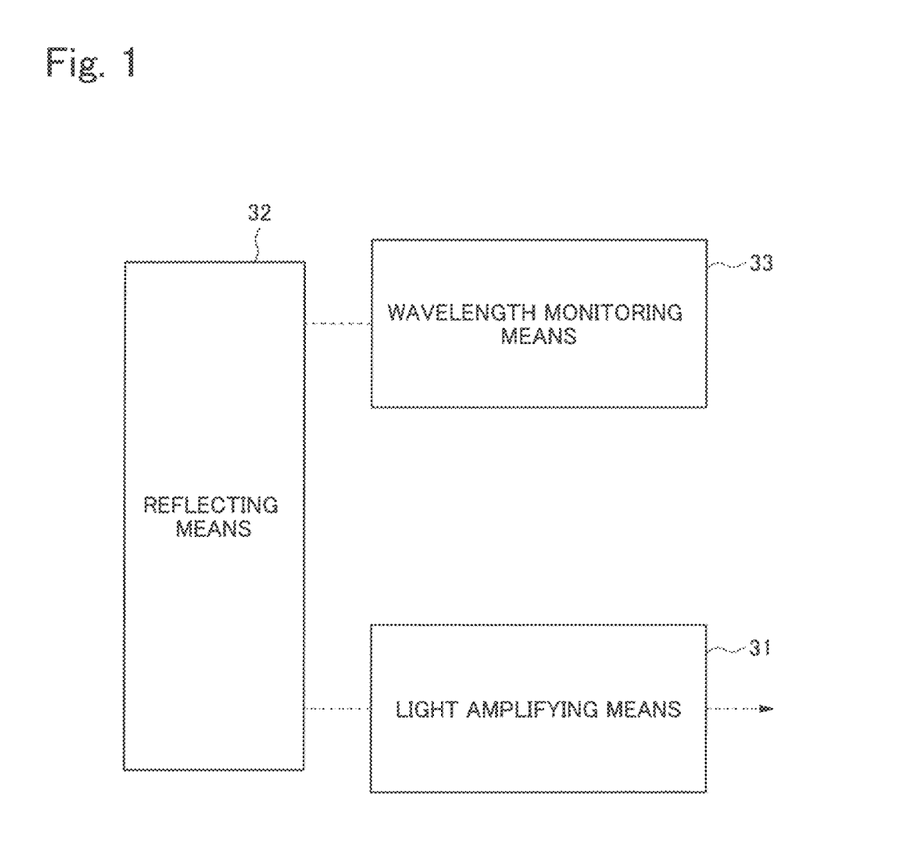
FIG. 1 is a configuration diagram for describing a light source module according to a broad concept example embodiment of the present invention.

A light source module according to a broadest concept example embodiment of the present invention is explained before explanation of a preferred example embodiment of the present invention. FIG. 1 is a configuration diagram for describing a light source module according to a broad concept example embodiment of the present invention.

The light source module of FIG. 1 includes a light amplifying means 31 and a wavelength monitoring means 33 for detecting a change in wavelength of light outputted from the light amplifying means 31. The light source module of FIG. 1 further includes a reflecting means 32 which is disposed between the light amplifying means 31 and the wavelength monitoring means 33, and reflects the light outputted from the light amplifying means 31 toward the wavelength monitoring means 33.

In the light source module of FIG. 1, the wavelength monitoring means 33 is disposed, for example, such that an optical axis of the light outputted from the light amplifying means 31 is nearly parallel to an optical axis of light to be inputted to the wavelength monitoring means 33. In other words, the light monitoring means 33 is disposed so that the light amplifying means 31 overlaps with the wavelength monitoring means 33 in a plane view. In the light source module of FIG. 1, for example, a reflecting means 32 is disposed so that a way that the optical axis of the light outputted from the light amplifying means 31 is nearly parallel to the optical axis of the light to be inputted to the wavelength monitoring means 33.

Thereby the light source module which has a reduced packaging area size and ensures wavelength precision is realized by using the wavelength monitoring means 33. A preferred example embodiment of the present invention is explained below in detail by referring to drawings.

First Example Embodiment

A light source module and a method of manufacturing the light source module of a first example embodiment of the present invention are explained. FIG. 2(a) is a plane view of the side of the top face of the light source module according to one example embodiment of the present invention, and FIG. 2(b) is a plane view of the side of the bottom face of the light source module. FIG. 3 is a side view of the light source module according to one example embodiment of the present invention.

(Configuration)

The light source module of the present example embodiment is a wavelength variable light source module in which a ring resonator is composed of a Planar Lightwave Circuit (PLC) and used as an external resonator. The wavelength variable light source module includes a wavelength locker using an etalon element.

The light source module of the example embodiment includes a Semiconductor Optical Amplifier (SOA) element 5 as one example of the light amplifying means.

As shown in FIG. 2(b) and FIG. 3, a Peltier element 8, as a temperature control element, is arranged on a bottom face of a package 1 of the light source module. The Peltier element 8 can heat and cool a surface thereof depending on a value and a direction of a flowing current. A carrier 2 is mounted on the Peltier element 8, and a PLC type wavelength variable filter 3, a collimator lens 6, an isolator 7, and a thermistor 9 are further mounted thereon. The PLC type wavelength variable filter 3 is a variable external resonator in which a ring resonator 4 is composed of the PLC (Planar Lightwave Circuit). The thermistor 9 is a temperature detector of the PLC. A wiring substrate 10 is arranged on the side of the package 1 of the light source module.

The collimator lens 6 connects a light from a front end face of the SOA element 5 with an optical fiber 21. The isolator 7 blocks a reflected return light from the optical fiber 21 side and allows the light to pass through only in the direction toward the optical fiber 21. The laser light outputted from the front end face which is a light output in the forward direction of the SOA element 5 is converted into a parallel light by the collimator lens 6 and is connected with the optical fiber 21 by a condensing lens 22. The light transmitted to the optical fiber 21 is utilized for a desired use, as a signal light.

As shown in FIG. 2(a) and FIG. 3, a Peltier element 17, as a temperature control element, is arranged on a package LID 20, as an example of a lid part of the package. A carrier 12 is mounted on the Peltier element 17, and a tap prism 13 which splits a monitoring laser light which is outputted from a back end face of the SOA element 5 in two directions, an etalon element 14, and a monitor PD (Photo Detector) 15 are further mounted thereon. The monitor PD 15 includes a first monitor PD 15a and a second monitor PD 15b. The second monitor PD 15b receives one light of the lights split by the tap prism 13. The other light of the lights split by the tap prism 13 enters the etalon element 14. The first monitor PD 15a receives a light which passes through the etalon element 14. Further a thermistor 16 is mounted on the carrier 12. The etalon element 14, the first monitor PD 15a, the second monitor PD 15b, and the like compose a wavelength monitoring means of the light source module. A wiring substrate 18 is mounted on the side of the package LID 20 of the light source module.

The light source module of the example embodiment includes a mirror 11, as an example of a reflecting means. The mirror 11 includes a first mirror 11a which reflects the laser light which is outputted from the back end face of the SOA element 5 and a second mirror 11b which reflects a light which is reflected by the first mirror 11a toward the wavelength monitoring means. The laser light which is outputted from the back end face of the SOA element 5 is, after passing through the PLC type wavelength variable filter 3, thereby the first mirror 11a and further reflected by the second mirror 11b to cause its optical path to be folded back, and is led to the wavelength monitoring means. As shown in FIG. 2(b) and FIG. 3, the first mirror 11a is fixed on the side of the bottom part of the package 1. Specifically the first mirror 11a is mounted on the carrier 2 of the package 1. As shown in FIG. 2(a) and FIG. 3, the second mirror 11b is fixed on the side of the package LID 20. Specifically the second mirror 11b is mounted on the carrier 12 on the side of the package LID 20.

The light source module of the example embodiment includes a ceramic wiring pillar 19, as an example of a pillar-shaped wiring, between the package 1 and the package LID 20. Wiring of an element and a circuit component mounted on the side of the package LID 20, for example, wiring of the wiring substrate 18 is electrically connected with wiring on the side of the package 1 through the ceramic wiring pillar 19.

In the light source module of the example embodiment, a wavelength variable light source function is composed of the PLC type wavelength variable filter 3 and the SOA element 5, and light output with a desired wavelength can be outputted toward the side of the optical fiber 21. The optical fiber 21 leads the light to the outside of the package 1. By calculating monitored values of the backward light output monitored by the monitor PDs 15a and 15b before and after transmission in the etalon element 14, respectively, accurate wavelength control can be performed.

In the light source module of the example embodiment, by folding back the backward light output of the PLC type wavelength variable filter 3 to the side of the top face by using the mirror 11, light output to the etalon element 14 mounted on the side of the package LID 20 becomes possible.

(Method of Manufacturing)

A main part of a method of manufacturing the light source module of the example embodiment is explained.

The SOA element 5 and the ring resonator 4 are mounted on the PLC type wavelength variable filter 3. Such PLC type wavelength variable filter 3, the first mirror 11a, the collimator lens 6, the isolator 7, and the like are mounted on the carrier 2. The carrier 2 is fixed on the bottom part of the package 1 with the Peltier element 8 in between.

The tap prism 13, the etalon element 14, the first monitor PD 15a, the second monitor PD 15b, and the second mirror 11b are mounted on the carrier 12. The carrier 12 is fixed on the package LID 20 with the Peltier element 17 in between.

Next, an opening of the package 1 is closed by the package LID 20 to hermetically seal the package 1. At this time, by using the ceramic wiring pillar 19, electric connection with the circuit component fixed on the side of the package LID 20 is acquired. For example, provision of an electric current to the wiring substrate 18 and the Peltier element 17 on the side of the package LID 20 can be performed from the side of the package 1 through the ceramic wiring pillar 19.

By mounting the ceramic wiring pillar 19 on the side of the bottom face of the package 1 in advance and solder-mounting it when the package LID 20 is closed, electric connection with the circuit component fixed on the side of the package LID 20 is achieved by easy manufacturing processes.

Advantageous Effects

In the example embodiment, the etalon element 14 is arranged on the side of the package LID 20, and the mirror 11 folds back the back light output to the side of the top face due to this arrangement. When elements mounted in the module are arranged on the top face and the bottom face, a space of the package can be efficiently used and the light source module can be configured with a reduced area. In the example embodiment, the light source module with a reduced packaging area size is realized while ensuring wavelength precision by using the etalon element 14.

For example, according to the example embodiment, the light source module with a reduced packaging area size is realized, compared with a configuration in which the backward light output of the PLC type wavelength variable filter or the SOA element is outputted in a plane direction and the etalon element and peripheral components are arranged in the same plane as the SOA element.

The mirror 11 is composed of the first mirror 11a reflecting the light outputted from the PLC type wavelength variable filter 3 and the second mirror 11b reflecting the light reflected by the first mirror 11a to the wavelength monitoring means. The first mirror 11a is fixed on the side of the bottom part of the package 1, and the second mirror 11b is fixed on the side of the package LID 20. Thereby when the opening of the package 1 is closed by using the package LID 20 to hermetically seal the package 1, the configuration in which the backward light output is folded back to the side of the top face is realized by simple manufacturing processes.

Electric connection with the element and the circuit component which are fixed on the side of the package LID 20 is acquired by using the ceramic wiring pillar 19. For example, provision of an electric current to the wiring substrate 18 and the Peltier element 17 on the side of the package LID 20 can be performed from the side of the package 1 through the ceramic wiring pillar 19.

Other Example Embodiments

Preferred example embodiments of the present invention are described above. However, the present invention is not limited to the above example embodiments. The above example embodiments describe the light output to the etalon element 14 mounted on the side of the package LID 20 becomes possible by folding back the backward light output of the PLC type wavelength variable filter 3 to the side of the top face by using the mirror 11. A direction and a position of the optical axis and each element are set using the top face of the carrier 2 as reference. The position and the direction of each element are relatively defined, and not limited to the arrangement of this example embodiment.

The direction in which the backward light output of the PLC type wavelength variable filter 3 is folded back by the mirror 11 is relative one, and is determined depending on a positional relationship between elements which compose the light source module, and not limited thereto. For example, even if the mirror 11 is arranged such that the backward light output of the PLC type wavelength variable filter 3 is folded back to the left side, the right side, or the bottom face side, a packaging area size is reduced while ensuring wavelength precision by the etalon element 14. A light source module in which the etalon element 14 is arranged on the left side, light side, or bottom face side with respect to a principal surface of the PLC type wavelength variable filter 3 may be composed as well.

Figure 2:
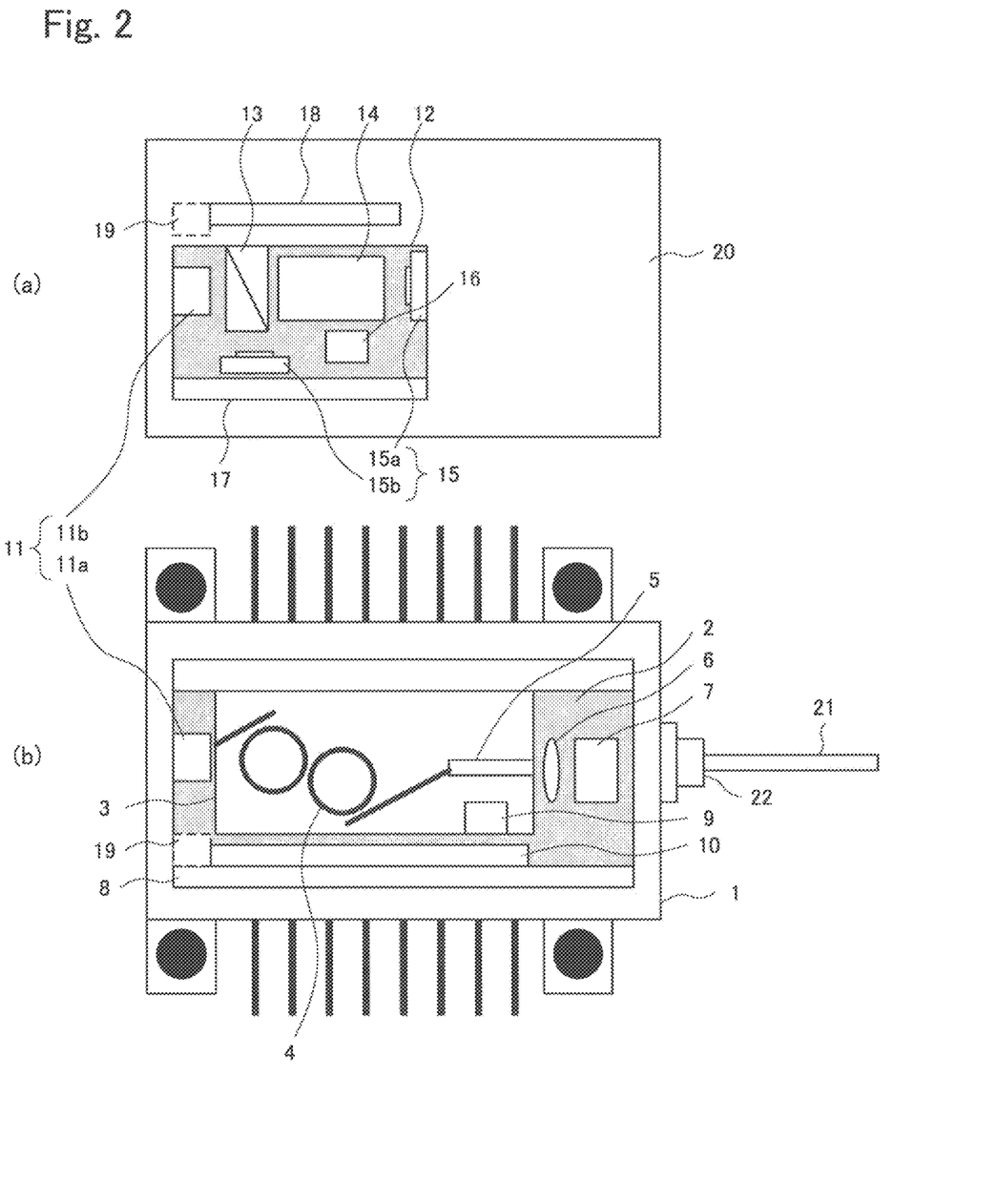
FIG. 2(a) is a plane view of the side of the top face of a light source module according to one example embodiment of the present invention.
FIG. 2(b) is a plane view of the side of the bottom face of the light source module.
Figure 3:
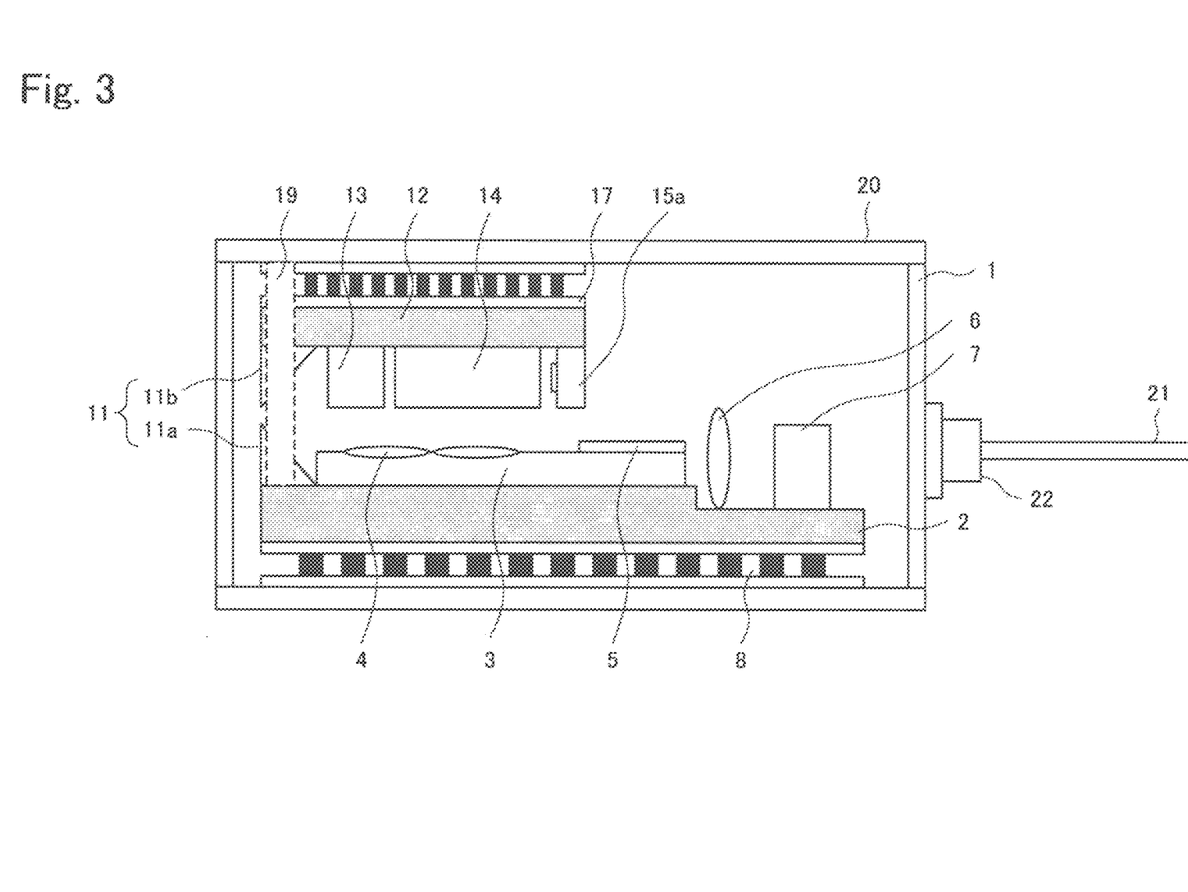
FIG. 3 is a side view of a light source module according to one example embodiment of the present invention.

The light source module illustrated in FIG. 2 and FIG. 3 is a light source module having an element arrangement in which the face on which the light source module is mounted is parallel to the principal surface of the PLC type wavelength variable filter 3. In a case where a light source module is arranged in such a way that he face on which the light source module is mounted is orthogonal to the principal surface of the PLC type wavelength variable filter 3, the mirror 11 may be arranged such that the backward light output of the PLC type wavelength variable filter 3 is folded back to the left side, the right side, or the bottom face side. Even in the light source module with such element arrangement, an effect similar to that of the example embodiment above described are expected.

A part or all of the example embodiments above mentioned may be described as following supplementary notes, but is not limited to the following.

(Supplementary Note 1)

A light source module is provided with a light amplifying means, a wavelength monitoring means for detecting a change in wavelength of light outputted from the light amplifying means, and a reflecting means which is disposed between the light amplifying means and the wavelength monitoring means, and which is for reflecting the light outputted from the light amplifying means toward the wavelength monitoring means.

(Supplementary Note 2)

The light source module of the supplementary note 1 is further provided with a package housing the light amplifying means, the wavelength monitoring means and the reflecting means.

(Supplementary Note 3)

The light source module of the supplementary note 1 or the supplementary note 2 in which the wavelength monitoring means is disposed to overlap with the light amplifying means in a plane view.

(Supplementary Note 4)

The light source module of any one of the supplementary note 1 to the supplementary note 3 in which the wavelength monitoring means is disposed so that an optical axis of the light outputted from the light amplifying means is nearly parallel to an optical axis of light to be inputted to the wavelength monitoring means.

(Supplementary Note 5)

The light source module of any one of the supplementary note 1 to the supplementary note 4 in which the reflecting means is disposed so that the optical axis of the light outputted from the light amplifying means is nearly parallel to the optical axis of the light to be inputted to the wavelength monitoring means.

(Supplementary Note 6)

The light source module of any one of the supplementary note 1 to the supplementary note 5 in which the package includes a bottom part and a lid part, the light amplifying means is fixed on the side of the bottom part, and the wavelength monitoring means is fixed on the side of the lid part.

(Supplementary Note 7)

The light source module of any one of the supplementary note 1 to the supplementary note 6 in which the reflecting means includes a first mirror for reflecting the light outputted from the light amplifying means, and a second mirror for reflecting light reflected by the first mirror toward the wavelength monitoring means.

(Supplementary Note 8)

The light source module of the supplementary note 7 in which the first mirror of the reflecting means is fixed on the side of the bottom part of the package, and the second mirror of the reflecting means is fixed on the side of the lid part of the package.

(Supplementary Note 9)

The light source module of any one of the supplementary note 6 to the supplementary note 8 is further provided with pillar-shaped wiring which is fixed between the bottom part of the package and the lid part of the package, and is electrically connected with a circuit component which is fixed on the side of the lid part of the package.

(Supplementary Note 10)

A method of manufacturing a light source module which houses at least a light amplifying means and a wavelength monitoring means for detecting a change in wavelength of light outputted from the light amplifying means in a package having a bottom part and a lid part, the method including fixing the light amplifying means on the side of the bottom part of the package, fixing the wavelength monitoring means on the side of the lid part of the package, fixing one part of a reflecting means for reflecting light outputted from the light amplifying means toward the wavelength monitoring means on the side of the bottom part of the package, fixing the other part of the reflecting means for reflecting the light outputted from the light amplifying means toward the wavelength monitoring means on the side of the lid part of the package, and housing the light amplifying means, the wavelength monitoring means, and the reflecting means between the bottom part of the package and the lid part of the package.

(Supplementary Note 11)

The method of manufacturing the light source module of the supplementary note 10 including electrically connecting pillar-shaped wiring with a circuit component fixed on the side of the lid part of the package by fixing the bottom part of the package and the lid part of the package after fixing the pillar-shaped wiring on the side of the bottom part of the package.

While the present invention has been particularly shown and described with reference to exemplary embodiments thereof, the present invention is not limited to these embodiments. It will be understood by those of ordinary skill in the art that various changes in form and details may be made therein without departing from the spirit and scope of the present invention as defined by the claims.

REFERENCE SIGNS LIST

1 Package
2, 12 Carrier
3 PLC type wavelength variable filter
4 Ring resonator
5 SOA element
6 Collimator lens
7 Isolator
8, 17 Peltier element
9, 16 Thermistor
10, 18 Wiring substrate
11 Mirror
11a First mirror
11b Second mirror
13 Tap prism
14 Etalon element 15 Monitor PD
15a First monitor PD
15b Second monitor PD
19 Ceramic wiring pillar
20 Package LID
21 Optical fiber
22 Condensing lens

The invention claimed is:

1. A light source module comprising:
a light amplifying unit;
a wavelength monitoring unit configured to detect a change in wavelength of light outputted from the light amplifying unit;
a reflecting unit configured to reflect the light outputted from the light amplifying unit toward the wavelength monitoring unit, the reflecting unit being disposed between the light amplifying unit and the wavelength monitoring unit; and
a package configured to house the light amplifying unit, the wavelength monitoring unit and the reflecting unit,
wherein the package includes a bottom part and a lid part,
wherein the light amplifying unit is fixed on a side of the bottom part,
wherein the wavelength monitoring unit is fixed on a side of the lid part, and
wherein the light source module further comprises pillar-shaped wiring fixed between the bottom part of the package and the lid part of the package, and electrically connected with a circuit component fixed on the side of the lid part of the package.

2. The light source module according to claim 1, wherein the wavelength monitoring unit is disposed to overlap with the light amplifying unit in a plane view.

3. The light source module according to claim 1, wherein the wavelength monitoring unit is disposed in such a way that an optical axis of the light outputted from the light amplifying unit is nearly parallel to an optical axis of light to be inputted to the wavelength monitoring unit.

4. The light source module according to claim 1, wherein the reflecting unit is disposed so that the optical axis of the light outputted from the light amplifying unit is nearly parallel to the optical axis of the light to be inputted to the wavelength monitoring unit.

5. The light source module according to claim 1, wherein the reflecting unit includes:
a first mirror configured to reflect the light outputted from the light amplifying unit; and
a second mirror configured to reflect light reflected by the first mirror toward the wavelength monitoring unit.

6. The light source module according to claim 5, wherein the first mirror of the reflecting unit is fixed on the side of the bottom part of the package, and
wherein the second mirror of the reflecting unit is fixed on the side of the lid part of the package.

7. A method of manufacturing a light source module which houses at least a light amplifying unit and a wavelength monitoring unit for detecting a change in wavelength of light outputted from the light amplifying unit in a package having a bottom part and a lid part, the method comprising:
fixing the light amplifying unit on a side of the bottom part of the package;
fixing the wavelength monitoring unit on a side of the lid part of the package;
fixing, on the side of the bottom part of the package, one part of a reflecting unit that reflects light outputted from the light amplifying unit toward the wavelength monitoring unit;
fixing, on the side of the lid part of the package, another part of the reflecting unit that reflects the light outputted from the light amplifying unit toward the wavelength monitoring unit;
housing the light amplifying unit, the wavelength monitoring unit, and the reflecting unit between the bottom part of the package and the lid part of the package;
fixing pillar-shaped wiring between the bottom part of the package and the lid art of the package; and
electrically connecting the pillar-shaped wiring with a circuit component fixed on the side of the lid part of the package.

8. The method of manufacturing the light source module according to the claim 7, wherein the electrically connecting the pillar-shaped wiring with the circuit component fixed on the side of the lid part of the package comprises fixing the bottom part of the package and the lid part of the package after fixing the pillar-shaped wiring on the side of the bottom part of the package.

* * * * *

UNITED STATES PATENT AND TRADEMARK OFFICE
CERTIFICATE OF CORRECTION

PATENT NO. : 10,644,478 B2
APPLICATION NO. : 15/757525
DATED : May 5, 2020
INVENTOR(S) : Isao Tomita It is certified that error appears in the above-identified patent and that said Letters Patent is hereby corrected as shown below:

In the Claims

Column 10, Line 32; In Claim 7, delete "art" and insert --part-- therefor

Signed and Sealed this
Twenty-fourth Day of November, 2020

Andrei Iancu
*Director of the United States Patent and Trademark Office*